United States Patent [19]

Jones

[11] 4,009,472
[45] Feb. 22, 1977

[54] DYNAMIC ASSOCIATIVE CELL
[75] Inventor: John Wyn Jones, Winchester, England
[73] Assignee: IBM Corporation, Armonk, N.Y.
[22] Filed: May 16, 1975
[21] Appl. No.: 578,300
[52] U.S. Cl. ............................ 340/173 R; 307/238; 340/172.5; 340/173 AM
[51] Int. Cl.² ........................................ G11C 15/00
[58] Field of Search ................. 340/173 R, 173 SP
[56] References Cited
UNITED STATES PATENTS
3,949,383  4/1976  Askin .................... 340/173 FF Primary Examiner—Terrell W. Fears
Attorney, Agent, or Firm—James E. Murray

[57] ABSTRACT

This specification describes an associative memory cell capable of performing logic functions. The cell comprises two transistors with their collectors connected to an output line and their emitters connected to an input line carrying either the true or complement of one variable. The bases of the two transistors can each be selectively connected to either the true and complement of a second variable or fixed at one of two reference or logic levels to permit the performing of sixteen different logic functions of the two input variables by the cell.

6 Claims, 2 Drawing Figures

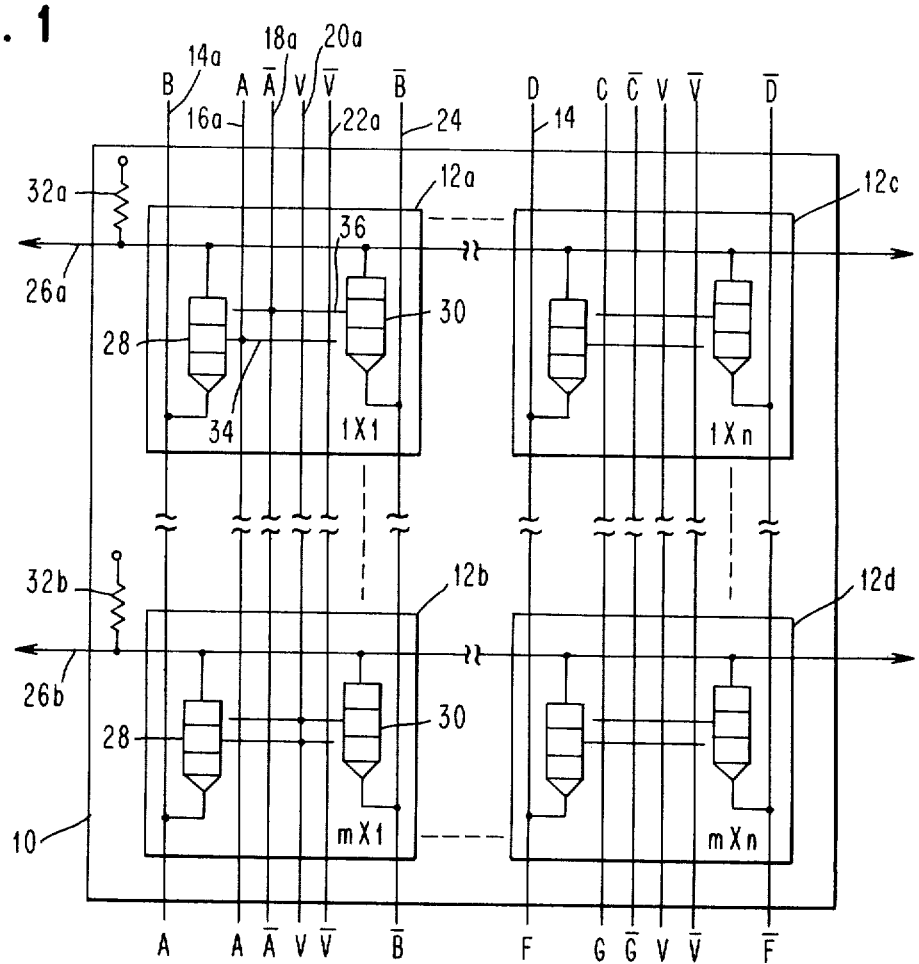

DYNAMIC ASSOCIATIVE CELL

BACKGROUND OF THE INVENTION

This invention relates to array logic and more particularly to cells on such memories which will perform logic functions within the array.

It has been suggested in the past to use multi state cells to perform logic in either associative or random access arrays. In Gardner et al U.S. Pat. No. 3,543,296 a functional memory employing four state cells is illustrated. These cells are each addressed by a single binary input which is complemented and fed through a mask to the balance bit lines of each cell so as to interrogate the cell for match or no match conditions. With this cell it is possible to store one of four possible states of information; three of which are decipherable in the associative memory configuration. In other words, with a cell in any one of three of the states it is possible to obtain a match condition when that cell is interrogated through the unmasked bit lines of the memory while it is impossible to obtain a match condition if the cell is in the fourth state when it is so interrogated. The three states which are decipherable are called the "zero", the "one" and the "X" or "Don't Care" states. The fourth state or the undecipherable state is referred to as the "Y" state.

Logic is being performed when one of these cells is interrogated for its logic state. Thus the functional memory in the Gardner et al patent is capable of performing logic. However, because only three of four logic states of each cell are decipherable by the configuration, twenty-five percent of the logic power of the array is lost. Furthermore, the four state associative cell configuration can only perform very simple logic functions and to perform higher order logic functions such as an Exclusive OR function requires additional logic circuitry at the output of the memory and/or additional words in the memory. Fleisher et al U.S. Pat. No. 3,593,317 describes a technique using decoders to perform high order logic in ordered arrays and the Weinberger U.S. Pat. No. 3,761,902 applies this technique to functional memorys to increase the logic power of such functional memorys by minimizing undecipherable states and permitting the performance of higher order logic functions. In the Fleisher et al and Weinberger patents the multiple state cells are either a single multiple state cell or a plurality of bi-stable or quadra-stable cells which are addressed through their bit lines by a decoder for decoding two or more data bits and provide logic results on their output lines. For instance, where a 16 state cell is used only one of the 16 possible states is undecipherable instead of one cut of four in the four state cells discussed above. Furthermore, it is possible to perform higher order logic functions such as the Exclusive OR function by using decoders as described in the Fleisher et al and Weinberger patents.

BRIEF DESCRIPTION OF THE INVENTION

In accordance with the present invention, a multiple state logic cell is provided which can perform higher order logic functions of the Fleisher et al and Weinberger patents without the use of the multiple bit decoders employed in those patents. The cell comprises two transistors with their collectors connected to an output line and their emitters connected to a line carrying either the true or complement of one variable. The bases of the two transistors can be selectively connected to the true and complement of a second variable or fixed at one of two reference or logic levels to permit the performing of 16 different binary logic functions of the two variables by the cell.

Therefore it is an object of the present invention to provide a new functional memory cell.

It is an object of the present invention to provide a new functional memory cell with increased logic power.

It is another object of the invention to provide a new logic performing cell.

It is a further object of the invention to provide a logic performing cell of increased logic power and simple configuration.

THE DRAWINGS

The above and other objects, features and advantages of the invention will be apparent from the preferred embodiment of the invention illustrated in the accompanying drawings of which:

FIG. 1 is an array containing storage cell of the present invention.

FIG. 2 is a truth table for the storage cells shown in the array of FIG. 1.

DETAILED DESCRIPTION

FIG. 1 shows an array 10 of cells 12 arranged in n columns by m rows of cells 12. Each column of cells 12 is addressed through six input lines 14, 16, 18, 20, 22, 24 and each row of cells is addressed by one output line 26. In each cell 12 there are two transistors 28 and 30 with their collectors both connected to the output line 26 and their emitters each coupled to one of the input lines 14 or 24. The bases of the transistors 28 and 30 are selectively connected to any one of the other four input lines 16 to 22. Two of these input lines 16 and 18 carry the true and complement of a second input variable while the other two 20 and 22 carry two different reference levels of potential; one representing a binary "1" input level and the other representing a binary "0" input level.

Each word line 26a is connected to a positive source through a resistor 32 so that any transistor 28 and 30 will be rendered conductive and produce a low logic level on the output line 26 connected to its collector when the emitter of that transistor 28 or 30 is at a down logic level at the same time the base of that transistor is at an up logic level. If none of the transistors 28 and 30 connected to a given output line 26 are so biased then the output line will be at an up logic level.

There are 16 different possible combinations of connections which can be made to the bases of the two transistors 28 and 30, with each combination giving a different binary logic function of the two input variables applied to the lines 14, 24, and 16 and 18 respectively. FIG. 2 is a truth table showing each of these logical functions. The row legends along the left hand edge of the truth table are the possible connections to the base of the left hand transistor 28 while the column legends at the top of the truth table are the possible connections to the base of the right hand device 30. The statement contained in each box is the logical function that will be performed by a cell when the bases of devices 28 and 30 of the cell are connected as indicated by the row and column legends of the box. Therefore, if the base of the left hand transistor 28 is connected to the input line 16a containing the true, A, of one variable while the base of the right hand transistor is connected to the line 18a carrying the complement, $\overline{A}$, of the same variable, then the signal on the output of line 26a will be the Exclusive OR function of the two input variables A and B. Another example would be if gates of both transistors 28 and 30 are connected to the line 20a containing the fixed up level as illustrated in cell 12b we obtain a Don't Care function of the input variable B on the output line 26b. Therefore it should be apparent that with each different combination of connections a different one of the functions in the boxes of the table of FIG. 2 will be performed.

The base of each of the transistors 28 and 30 is connected to a line 34 or 36 arranged transverse to and intersecting each of its input lines. The lines are arranged on opposite sides of an insulating layer on the surface of the monolithic chip containing the array. For instance the output lines 26 and the transverse lines 34 and 36 could be diffused lines in the surface of the chip and the input lines 14 to 24 could be metal lines on the surface of an insulating layer on top of that surface of the chip. Connections between lines 16 to 24 and lines 34 and 36 can be made through holes in the insulating layer. Alternatively the lines can be arranged and fabricated as the addressing grid described in Cox et al application Ser. No. 537,219, filed Dec. 30, 1974.

The arrays shown in FIG. 1 can be compounded as shown in the above mentioned Cox et al application or in Weinberger application Ser. No. 537,217, filed Dec. 30, 1974 with the outputs of one array feeding inputs to another array. Furthermore, the input lines and output lines of the array may be broken as described in the above mentioned Weinberger and Cox applications so that more than one logic function can be performed on a given row or column of the array. For instance, the output line 26a could be split so that a function of input variables A and B could be performed in cell 12a and the result placed in the left hand segments of line 26a while a different function involving variables C and D can be performed by cell 12c and the resultant placed on the right hand segment of line 26a. Likewise the lines 14 can be split. For instance, lines 14 through 22b can be split so that input variables C and D can be used to generate functions along the upper segments of those lines with variables F and G can be used to form variables on the lower segments of those lines.

Other changes that can be made would be to have more than three sets of input addressing lines and have the emitters of transistors 28 and 30 selectably connectable to any one of the input lines in the same manner as the bases can be connected to those lines. This would allow functions of different sets of variables to be performed in the same column of cells. Also multiple emitter transistors could be used to perform functions of more than three variables. Another change that could be made would be to use field effect transistors in place of transistors 28 and 30.

Obviously many other changes could be made by those skilled in the art. Therefore, it should be understood that the above and other changes in form and details may be made therein without departing from the spirit and scope of the invention.

What is claimed is:

1. In an array for performing logic functions a new storage cell comprising;
two, three terminal semi-conductive devices,
an output line coupled through a load device to a source of potential and to a first terminal of both the transistors,
input lines for carrying the true and complement of at least two input variables and two different reference levels, one of the reference levels representing an up logic level of the input variables and the other reference level representing a down logic level of the input variables, and
connection means for coupling a second terminal of one of the semi-conductive devices to an input level carrying the true of one input variable and the second terminal of the other transistor to the input line carrying the complement of the same input variable and selective connection means for selectively connecting the third terminal of the semi-conductive device to at least one of the other input lines whereby one of sixteen logic functions of two variables can be performed by the storage cell.

2. The storage cell of claim 1 wherein the devices have a control terminal and two controlled terminals wherein one of the controlled terminals is coupled to the output line, the other of the controlled terminals is coupled to either the true or complement of one of the input variables and the control terminals is coupled to the other of the input lines.

3. The storage cell of claim 2 wherein said semi-conductive devices are transistors and the first controlled terminal is the collector, the second controlled terminal is the emitter and the control terminal is the base.

4. An array for performing logic functions comprising,
a plurality of sets of input lines for carrying both the true and complement of at least two input variables,
a plurality of output lines intersecting said sets of input lines,
reference potential means at intersections of output lines with sets of input lines,
a pair of three terminal semi-conductive devices located at each of said intersections,
coupling means at said intersections coupling the first terminal of each of said semi-conductive devices in the pair to the output line, the second terminal of one of the two semi-conductive devices to an input line containing the true of one of the input variables, the second terminal of the other of the two semi-conductive devices to the input line carrying the complement of that one input variable; and variable connection means at each of said intersections for selectively connecting the third terminal of the two semi-conductive devices each to any one of the other input lines in the set or the reference potential means to perform a logic function determined by the selective connection variable involving the first or both of the input variables on the set of input lines passing through the intersection.

5. The storage cell of claim 4 wherein the devices have a control terminal and two controlled terminals wherein one of the controlled terminals is coupled to the input line and the other of the controlled terminals is coupled to either the true or complement of one of the input variables and the control terminals is coupled to the other of the input lines.

6. The storage cell of claim 4 wherein said semi-conductive devices are transistors and the first controlled terminal is the collector, the second controlled terminal is the emitter and the control terminal is the base.

* * * * *